United States Patent
Ong et al.

(10) Patent No.: US 7,103,815 B2
(45) Date of Patent: *Sep. 5, 2006

(54) TESTING OF INTEGRATED CIRCUIT DEVICES

(75) Inventors: Adrian E. Ong, Pleasanton, CA (US); Fan Ho, San Ramon, CA (US)

(73) Assignee: Inapac Technology, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/870,365

(22) Filed: Jun. 17, 2004

(65) Prior Publication Data

US 2004/0225937 A1   Nov. 11, 2004

Related U.S. Application Data

(63) Continuation of application No. 09/967,389, filed on Sep. 28, 2001, now Pat. No. 6,754,866.

(51) Int. Cl.
*G11C 29/00* (2006.01)
*G06F 7/02* (2006.01)
*H04L 7/00* (2006.01)

(52) U.S. Cl. .................. 714/736; 714/819; 713/401

(58) Field of Classification Search ................ 714/736, 714/814, 819, 738, 798, 799, 724, 824, 718, 714/719; 713/400, 401, 500, 600; 324/210, 324/211, 212
See application file for complete search history.

(56) References Cited

U.S. PATENT DOCUMENTS

| | | | |
|---|---|---|---|
| 4,773,028 A * | 9/1988 | Tallman | .............. 714/736 |
| 5,326,428 A | 7/1994 | Farnworth et al. | |
| 5,457,400 A | 10/1995 | Ahmad et al. | |
| 5,479,105 A | 12/1995 | Kim et al. | |
| 5,523,697 A | 6/1996 | Farnworth et al. | |
| 5,619,461 A | 4/1997 | Roohparvar | |
| 5,657,284 A | 8/1997 | Beffa | |
| 5,677,885 A | 10/1997 | Roohparvar | |
| 5,751,015 A | 5/1998 | Corbett et al. | |
| 5,751,987 A | 5/1998 | Mahant-Shetti et al. | |
| 5,801,452 A | 9/1998 | Farnworth et al. | |
| 5,805,609 A | 9/1998 | Mote, Jr. | |
| 5,807,762 A | 9/1998 | Akram et al. | |
| 5,825,697 A | 10/1998 | Gilliam et al. | |
| 5,825,782 A | 10/1998 | Roohparvar | |
| 5,923,600 A | 7/1999 | Momohara | |
| 5,925,142 A | 7/1999 | Raad et al. | |
| 5,936,260 A | 8/1999 | Corbett et al. | |
| 5,959,310 A | 9/1999 | Akram et al. | |
| 5,966,388 A | 10/1999 | Wright et al. | |
| 6,026,039 A | 2/2000 | Kim et al. | |
| 6,047,393 A * | 4/2000 | Yamada | .............. 714/718 |
| 6,072,326 A | 6/2000 | Akram et al. | |
| 6,087,676 A | 7/2000 | Akram et al. | |
| 6,104,658 A | 8/2000 | Lu | |

(Continued)

*Primary Examiner*—Christine T. Tu
(74) *Attorney, Agent, or Firm*—Sidley Austin LLP (57) ABSTRACT

An integrated circuit device includes a data buffer, coupled to an external connector, providing a data signal on the external connector. A test buffer, coupled to the data buffer, receives the data signal and provides a testing output signal to a delay circuit. The delay circuit receives the testing output signal at a first clock rate internal to the integrated circuit device and compares test data in the testing output signal to expected test signal values. The delay circuit provides a result to an external connector at a second clock rate that is slower than the first clock rate.

22 Claims, 9 Drawing Sheets

U.S. PATENT DOCUMENTS

| | | |
|---|---|---|
| 6,137,167 A | 10/2000 | Ahn et al. |
| 6,154,860 A | 11/2000 | Wright et al. |
| 6,157,046 A | 12/2000 | Corbett et al. |
| 6,188,232 B1 | 2/2001 | Akram et al. |
| 6,194,738 B1 | 2/2001 | Debenham et al. |
| 6,208,157 B1 | 3/2001 | Akram et al. |
| 6,216,241 B1 | 4/2001 | Fenstermaker et al. |
| 6,243,839 B1 | 6/2001 | Rooparvar |
| 6,243,840 B1 | 6/2001 | Raad et al. |
| 6,263,463 B1 * | 7/2001 | Hashimoto ............... 714/724 |
| 6,274,937 B1 | 8/2001 | Ahn et al. |
| 6,286,115 B1 | 9/2001 | Stubbs |
| 6,294,839 B1 | 9/2001 | Mess et al. |
| 6,298,001 B1 | 10/2001 | Lee et al. |
| 6,300,782 B1 | 10/2001 | Hembree et al. |
| 6,310,484 B1 | 10/2001 | Akram et al. |
| 6,320,201 B1 | 11/2001 | Corbett et al. |
| RE37,611 E | 3/2002 | Roohparvar |
| 6,365,421 B1 | 4/2002 | Debenham et al. |
| 6,366,487 B1 | 4/2002 | Yeom |
| 6,392,948 B1 | 5/2002 | Lee |
| 6,395,565 B1 | 5/2002 | Akram et al. |
| 6,396,291 B1 | 5/2002 | Akram et al. |
| 6,407,566 B1 | 6/2002 | Brunelle et al. |
| 6,441,479 B1 | 8/2002 | Ahn et al. |
| 6,445,625 B1 | 9/2002 | Abedifard |
| 6,483,760 B1 | 11/2002 | Kang |
| 6,484,279 B1 | 11/2002 | Akram |
| 6,502,215 B1 | 12/2002 | Raad et al. |
| 6,507,885 B1 | 1/2003 | Lakhani et al. |
| 6,519,725 B1 | 2/2003 | Huisman et al. |
| 6,732,304 B1 * | 5/2004 | Ong ...................... 714/718 |
| 6,754,866 B1 * | 6/2004 | Ong et al. ............. 714/736 |

* cited by examiner

FIG. 10 ved test data to expected test data values. The method further includes staggering the comparison of the test data to the expected test data values and providing an output signal to external integrated circuit test equipment at a second clock rate that is slower than the first clock rate. The output signal indicates a result of the comparison.

TESTING OF INTEGRATED CIRCUIT DEVICES

RELATED APPLICATION

The present application is a continuation of U.S. patent application Ser. No. 09/967,389, filed Sep. 28, 2001, now U.S. Pat. No. 6,754,866, which is related to U.S. Pat. No. 6,732,304, filed Sep. 21, 2000, both of which are assigned to the present assignee and hereby incorporated by reference in their entireties.

BACKGROUND OF THE INVENTION

1. Field of the Invention

The present invention relates generally to electrical devices and, more particularly, to the testing of integrated circuit devices.

2. Related Art

Semiconductor or integrated circuit devices have continually evolved to provide improvements such as miniaturization, reduced power consumption, reduced cost, and increased speed. One consequence of the rapidly increasing speed (e.g., increasing data rate) of semiconductor devices is that adequate testing of the semiconductor devices becomes difficult and expensive. For example, integrated circuits now routinely operate at data rates above 100 MHz. For testing purposes, such data rates may require expensive, specialized automated test equipment.

When data rates reach or exceed 400 MHz, current commercially available automated test equipment may fail to detect the data with sufficient accuracy in order to perform the desired testing. In particular, during testing, signal parameters such as voltage, current, and timing or skew must be precisely controlled and monitored, for example, using currently employed techniques and systems, such as special load boards and handler designs. As data rates continue to increase, these currently employed techniques and systems, taken alone, will not be adequate to perform high-speed testing. As a result, there is a need for improved methods and techniques for testing integrated circuit devices.

BRIEF SUMMARY OF THE INVENTION

In accordance with some embodiments of the present invention, circuitry is provided that latches and extends each cycle of integrated circuit test data for multiple cycles (i.e., n cycles). A low-frequency integrated circuit tester can then accurately detect the test data at a fraction of the data rate or data transfer speed of the integrated circuit (e.g., the data rate multiplied by 1/n). To eliminate the increased test time resulting from the reduced data rate, the test data may also be compressed.

In accordance with one embodiment of the present invention, an integrated circuit device includes a data buffer, coupled to an external connector, providing a data signal on the external connector. A test buffer, coupled to the data buffer, receives the data signal and provides a testing output signal to a delay circuit. The delay circuit receives the testing output signal at a first clock rate internal to the integrated circuit device and compares test data in the testing output signal to expected test signal values. The delay circuit provides a result to an external connector at a second clock rate that is slower than the first clock rate.

In accordance with another embodiment of the present invention, a method of testing an integrated circuit device includes receiving test data at a first clock rate internal to the integrated circuit device and comparing the received test data to expected test data values. The method further includes staggering the comparison of the test data to the expected test data values and providing an output signal to external integrated circuit test equipment at a second clock rate that is slower than the first clock rate. The output signal indicates a result of the comparison.

In accordance with another embodiment, an integrated circuit device system includes a first integrated circuit device to be tested that outputs test data at a first clock rate internal to the first integrated circuit device. The system further includes a second integrated circuit device connected to the first integrated circuit device and that receives the test data from the first integrated circuit device and provides a result in response to the test data at a second clock rate that is slower than the first clock rate.

In various embodiments of the invention, circuitry and methods are provided for receiving test result data which is generated at the speed of the normal operational clock signal of the integrated circuit device, and outputting a compressed form of the test result data at the speed of a second clock signal which is slower than the normal operational clock signal. Accordingly, the integrated circuit device can be tested with test equipment that operates at a speed which is slower than the frequency of the normal operational clock signal of the device.

A more complete understanding of the present invention will be afforded to those skilled in the art, as well as a realization of additional advantages thereof, by a consideration of the following detailed description of one or more embodiments. Reference will be made to the drawings that will first be described briefly.

It should be understood that exemplary embodiments are described herein, but that these embodiments are not limiting and that numerous modifications and variations are possible in accordance with the principles of the present invention. In the drawings, like reference numerals are used to identify like elements illustrated in one or more of the figures.

DETAILED DESCRIPTION OF THE INVENTION

Figure 1:
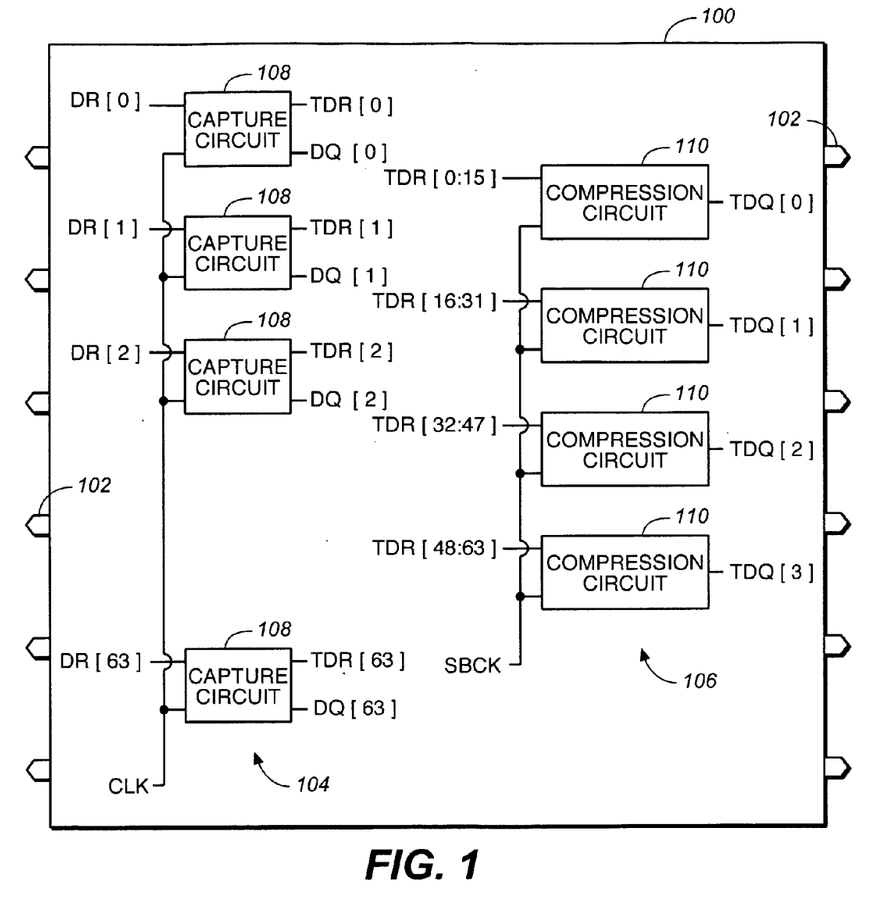
FIG. 1 is a block diagram of integrated circuit device, in accordance with an embodiment of the present invention.

FIG. 1 is a block diagram of an integrated circuit (IC) device 100, in accordance with an embodiment of the present invention. Integrated circuit device 100 represents any type of integrated circuit device (also referred to herein as a packaged device or chip) that requires testing, such as, for example, by automated test equipment or an integrated circuit tester. For example, integrated circuit device 100 can be a synchronous dynamic random access memory (SDRAM), but the present invention is applicable to other types of memory chips such as static RAM (SRAM), dynamic RAM (DRAM), non-volatile RAM (NVRAM), programmable read only memory (PROM), erasable programmable ROM (EPROM), electrically erasable programmable ROM (EEPROM), and flash memory.

Furthermore, from the description herein it will become apparent that the present invention is applicable for testing other types of integrated circuit devices. For example, the present invention is also applicable to logic chips, such as gate arrays or programmable logic devices, and processor or specialized chips, such as an application specific integrated circuit (ASIC), a microprocessor, a microcontroller, or a digital signal processor (DSP).

It should also be understood that the present invention is not limited by the type of chip packaging and is applicable for any type of chip or multi-chip semiconductor packaging. As an example, the integrated circuit device 100 can be packaged as a standard ball grid array (BGA) or thin quad flatpack (TQFP) having 144 pins or more. However, other types of packaging may be used. For example, the chip packaging may have a ceramic base with chips wire bonded or employing thin film substrates, mounted on a silicon substrate, or mounted on a PCB substrate such as a multi-chip package (MCP). The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

Integrated circuit device 100 may comprise one or more semiconductor dies (commonly referred to as "chips"). Each die is a separate monolithic structure formed from, for example, silicon or other suitable material.

Integrated circuit device 100 may operate at a particular clock frequency or operational speed which defines the data rate for the device 100. For modern integrated circuit devices, this data rate can be greater than the highest frequency at which older testing equipment or machines are able to test. The present invention addresses, among other things, this problem.

According to the present invention, systems and methods are provided for testing integrated circuits, such as integrated circuit device 100. For one exemplary system, circuitry is provided that latches and extends each cycle of integrated circuit test data for multiple cycles of the operational clock of integrated circuit device 100. A low-frequency integrated circuit tester can then accurately detect the test data at a fraction of the data rate of the integrated circuit. In one embodiment, to eliminate the increased testing time which otherwise might result from the reduced data rate, the test data may also be compressed.

As shown, an integrated circuit device 100 includes a number of external terminals 102, a data output circuit 104, and an external testing output circuit 106. External terminals 102 support the input/output of data/information to and from integrated circuit device 100. External terminals 102 and can be part of one or more data paths for integrated circuit device 100. As an example, integrated circuit device 100 can be a SDRAM with n data bit paths, each data bit path operating substantially in the same fashion.

In one embodiment, none of the external terminals 102 are dedicated only to the testing of integrated circuit device 100. This reduces pin count for the integrated circuit device 100. As described herein, circuitry in provided in the output and/or input data paths of one more chips of device 100, thus allowing the chips to be tested without the need for dedicated external terminals.

Data output circuit 104 is used generally for the output of data signals (e.g., DR<0>, DR<1>, DR<2>, ... DR<63>) from one or more semiconductor die within-integrated circuit device 100. The data (DR<0:63>) signals can be either data generated by integrated circuit device 100 during normal operation or data that is generated as test data during testing of the device 100. This data (DR<0:63>) may be generated at the speed of the normal operational clock (CLK) signal of the semiconductor die, which may also be the speed of the integrated circuit device 100. Data which is generated during normal operation can be output from the semiconductor die in output data signals (e.g., DQ<0>, DQ<1>, DQ<2>, ... DQ<63>) or test result data signals (e.g., TDR<0>, TDR<1>, TDR<2>, ... TDR<63>).

Data output circuit 104 may comprise or be a part of one or more data paths, each of which includes a respective bonding pad for the input and output of signals to and from the respective semiconductor die.

In one embodiment, data output circuit 104 may function to buffer data which is received by or transmitted out of integrated circuit device 100 during its normal operation. Data output circuit 104 receives and transmits at the clock (CLK) signal, which may run at the normal operational frequency of integrated circuit device 100. Since this operational frequency can be relatively high, then in normal operation, the communication of data coming into or sent out of integrated circuit device 100 occurs at a relatively high data rate.

As depicted, data output circuit 104 comprises one or more capture circuits 108. Each capture circuit 108 generally functions to capture a respective data bit (DR<i>), delay the data bit, and provide a corresponding output data bit (DQ<i>) or test result bit (TDR<i>). Each capture circuit 108 may be connected through one or more bonding pads to one or more external terminals 102. In one embodiment, capture circuits 108 may be implemented on the same semiconductor die. Alternatively, capture circuits 108 may be located on plurality of semiconductor dies. A separate capture circuit 108 may be provided for each data bit path i (e.g., where $1 \leq i \leq 64$).

External testing output circuit 106 is coupled to data output circuit 104. As used herein, the terms "coupled," "connected," or any variant thereof means any coupling or connection, either direct or indirect, between two or more elements. External testing output circuit 106 functions to receive test result data (e.g., TDR<0:63>) which is generated by the integrated circuit device 100 at the speed of its normal operational clock (CLK) signal, and to output a compressed form of the data as test output data (e.g., TDQ<0>, TDQ<1>, TDQ<2>, ... TDQ<3>) at the speed of a second clock signal (e.g., serial burst clock (SBCK) signal. The second clock signal can be slower than the normal operational clock signal of the integrated circuit device 100. Accordingly, the integrated circuit device 100 can be tested with test equipment that operates at a speed which is slower than the frequency of the normal operational clock signal of the device 100.

As depicted, external testing output circuit 106 comprises a number of compression circuits 110. Each compression circuit 110 may be coupled to a respective plurality of capture circuits 108 of data output circuit 104. For example, in one embodiment, one compression circuit 110 may be connected to sixteen capture circuits 108. Compression circuits 110 generally function to compress the output of the respective capture circuits 108, for example, in a 16:1 compression.

In one embodiment, external testing output circuit 106 may be incorporated into the same semiconductor die as data output circuit 104. Alternatively, external testing output circuit 106 may be incorporated into another semiconductor die, which is separate from the die on which data output circuit 104 is implemented. For example, external testing output circuit 106 may be provided on a separate die, such as an application specific integrated circuit (ASIC). Such die may even be implemented in a separate packaged device which would have its own external connectors that receive test result data (TDR<0:63>) signals and provide test output data (TDQ<0:3>) signals to the integrated circuit test equipment.

Figure 2:
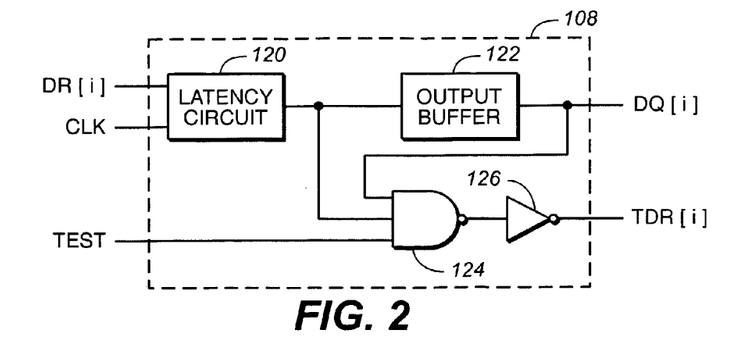
FIG. 2 is a block diagram of an exemplary implementation of a capture circuit, in accordance with an embodiment of the present invention.

FIG. 2 is a block diagram of an exemplary implementation of a capture circuit 108, in accordance with an embodiment of the present invention. As depicted, capture circuit 108 includes a latency circuit 120, an output buffer 122, a NAND gate 124, and an inverter 126. Capture circuit 108 can be part of a data bit path in integrated circuit device 100.

Latency circuit 120 may be included in this exemplary implementation, but may not be required for other types of applications. Latency circuit 120 may function as a latch. In one embodiment, as shown, latency circuit 120 receives the clock (CLK) signal and a respective data bit (DR<i>) signal and provides the data bit (DR<i>) to a respective output buffer 122 after a delay. The clock (CLK) signal can be the normal operational clock of the integrated circuit device 100. Within integrated circuit device 100, the data bits (DR<i>) may be generated at the normal operating speed or frequency for the device 100. The data bits (DR<i>) can be generated during normal operation of the integrated circuit device 100 or during testing of the device 100.

Output buffer 122 is coupled to latency circuit 120 and receives the delayed data bit (DR<i>) signal. Output buffer 122 outputs a respective output data bit (DQ<i>) signal in response. The output data bit (DQ<i>) signal can be generated in the respective semiconductor die during normal operation of integrated circuit device 100. Each output buffer 106 may be connected through a bonding pad to one of external terminals 102 to provide the respective output data bit (DQ<i>).

NAND gate 124 also receives the respective delayed data bit (DR<i>) signal from a respective latency circuit 120 along with a test enable (TEST) signal. NAND gate 124 may be coupled to inverter gate 126, which inverts the output of the NAND gate 124 to provide a respective test result data (TDR<i>) signal. The test result data bits (TDR<i>) can be generated in the respective semiconductor die during testing of the integrated circuit device 100. In one embodiment, when the test enable (TEST) signal is high, NAND gate 124 provides the inverse of a respective data bit (DR<i>), which is inverted by a respective inverter gate 126 to provide a respective test result data TDR<i>) signal. This test result data (TDR<i>) signal can be provided to the external testing output circuit 106. In one embodiment, as depicted, NAND gate 124 may also receive the output of output buffer 122 at one of its inputs. This allows testing of the output buffer 122.

In normal operation for integrated circuit device 100, the test enable (TEST) signal has a first value (e.g., a logic low signal value; references herein to logic "high" or logic "low" signal levels will be denoted as logic high or logic low, respectively)). For any data bit DR<i> signal which is received, capture circuit 108 outputs an output data bit (DQ<i>) signal. When the integrated circuit device 100 is being tested, the test enable (TEST) signal has a second value (e.g., a logic high signal value). This causes the capture circuit 108 to output a test result data (TDR<i>) signal in response to any data DR<i> signal which is received.

Figure 3:
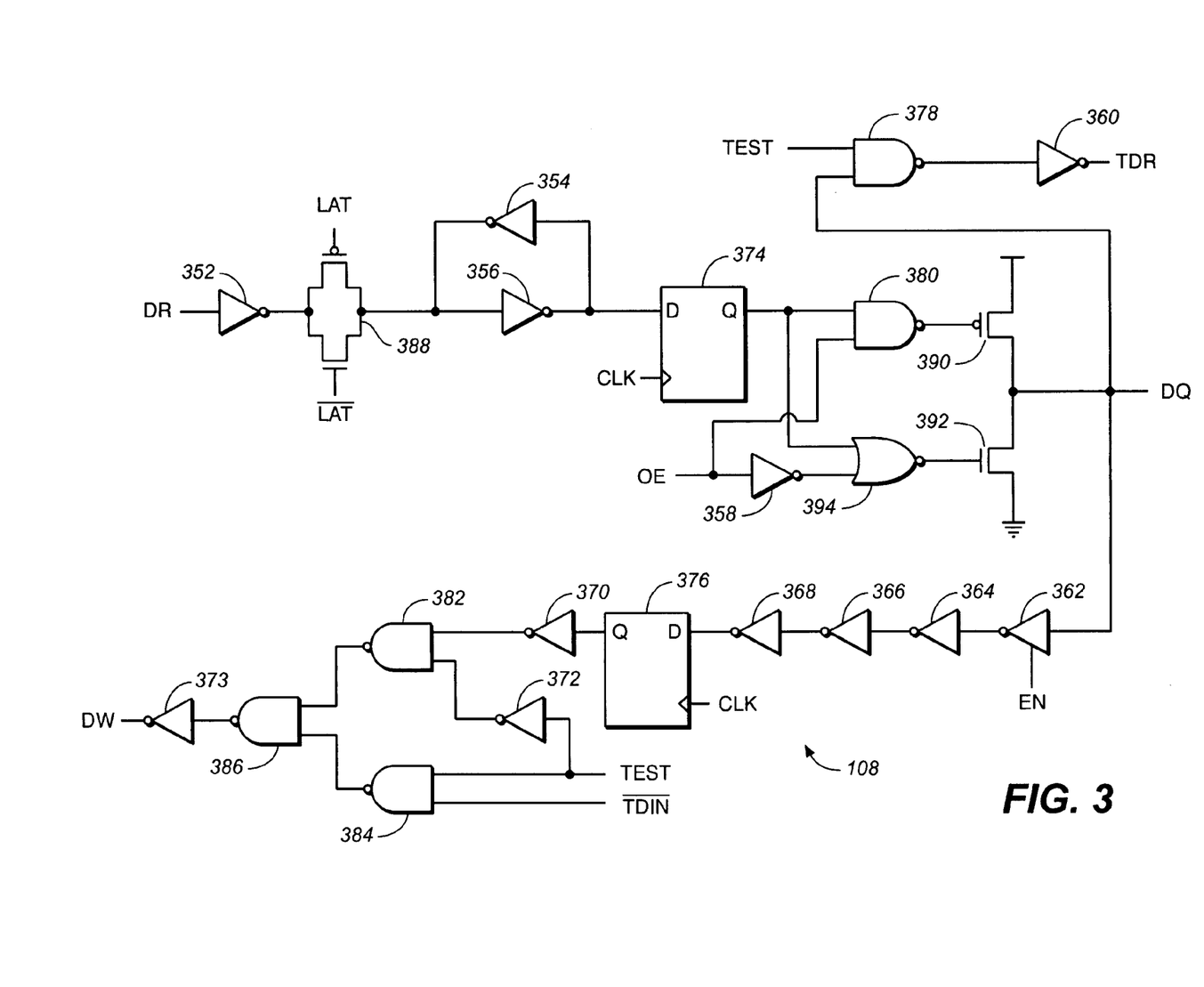
FIG. 3 is schematic diagrams of an exemplary implementation of the capture circuit, in accordance with embodiments of the present invention.

An exemplary implementation for capture circuit 108 is depicted in the schematic diagram of FIG. 3. As depicted, in this implementation, capture circuit 108 comprises a plurality of inverter gates 352, 354, 356, 358, 360, 362, 364, 366, 368, 370, 372, 373, a plurality of DQ flip-flops 374, 376, a plurality of NAND gates 378, 380, 383, 384, 386, a pass gate 388, transistors 390, 392, and NOR gate 394. The operation of this implementation for capture circuit 108 would be understood by one of ordinary skill.

Inverter gate 352, pass gate 388, inverters 354 and 356 (which form a latch), flip-flop 374, NAND gate 380, inverter gate 358, NOR gate 394, NAND gate 378, inverter gate 360, and transistors 390, 392 may be part of an output data path for the integrated circuit device 100, for example, for reading data from the device. This data may be conveyed in a data read (DR) signal which is received at an input terminal for capture circuit 108. A test enable (TEST) signal causes the circuitry to be placed in a "test" mode. An output enable (OE) signal enables the output of data.

Inverter gates 362, 364, 366, 368, flip-flop 376, inverter gates 370, 372, NAND gates 382, 384, 386, and inverter gate 373 can be part of an input data path for the integrated circuit device 100, for example, for writing data to the device. The data may be conveyed to the device 100 in a data write (DW) signal generated by this implementation. The circuitry may receive a test data input (TDIN) signal, for example, from an implementation of external output testing circuit 106 (see FIGS. 6A and 6B).

Figure 4:
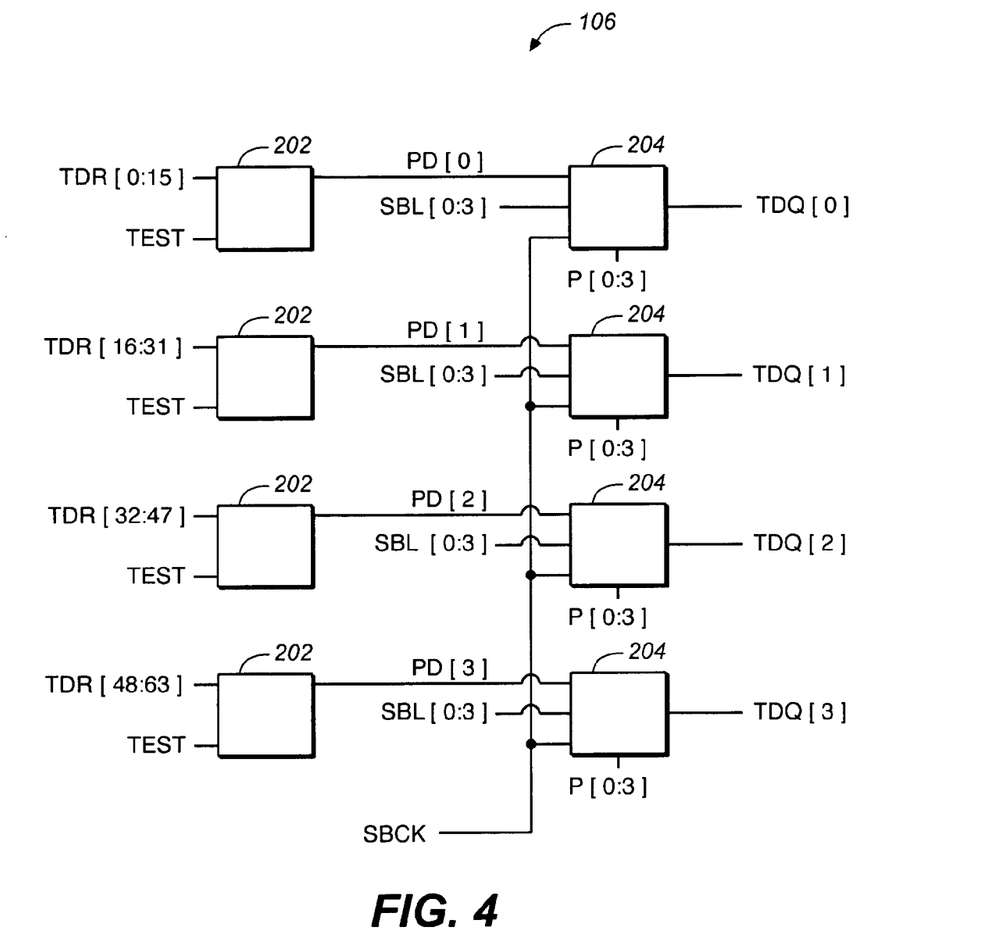
FIG. 4 is a block diagram illustrating an external testing output circuit, in accordance with an embodiment of the present invention.

FIG. 4 is a block diagram illustrating an external testing output circuit 106, in accordance with an embodiment of the present invention. As depicted, external testing output circuit 106 includes a number of test buffers 202 and serial burst compression circuits 204. A test buffer 202 and corresponding serial burst compression circuit 204 may be replicated for each data path.

As shown, each test buffer 202 provides 16:1 compression, but as described in further detail below, any ratio of compression or no compression may be provided. In general, test buffers 202 receive respective test result data signals (TDR<0:15>, TDR<16:31>, TDR<32:47>, TDR<48:63>) and the test enable (TEST) signal and, in response, provide respective output signals (PD<0>, PD<1>, PD<2>, PD<3>). As an example, for the 16:1 compression, a first test buffer 202 receives test result data signals (TDR<0:15>) and the test enable (TEST) signal and provides output signal (PD<0>). The remaining test buffers 202 receive respective test result data signals (TDR<16:31>, TDR<32:47>, and TDR<48:63>) and provide respective output signals (PD<1>, PD<2>, and PD<3>).

Serial burst compression circuits 204 receive output signals (PD<0>, PD<1>, PD<2>, and PD<3>) along with a serial burst clock (SBCK) signal, serial burst latch signals (SBL<0>, SBL<1>, SBL<2>, and SBL<3>), and expected test data signals (P<0>, P<1>, P<2>, and P<3>) and, in response, provide respective test data output signals (TDQ<0>, TDQ<1>, TDQ<2>, and TDQ<3>). Test output data (TDQ<0:3>) signals may be provided to external testing equipment or circuitry at the frequency of serial burst clock (SBCK) signal for testing of the integrated circuit device 100. Serial burst clock (SBCK) signal may have a frequency that is lower than that of the normal operational clock (CLK) signal for integrated circuit device 100, thus allowing device 100 to be tested with existing or potentially older (and less expensive) testing equipment. An exemplary circuit implementation for a serial burst compression circuit 204 is shown and described in greater detail below with reference to FIG. 5.

As discussed herein, each data path can be substantially identical (e.g., the data path including first test buffer 202 and the first serial burst compression circuit 204 is substantially identical to the data path including second test buffer 202 and the second serial burst compression circuit 204).

As shown in FIG. 4, there is one test buffer 202 for every sixteen test result data signals (e.g., TDR<0:15>, TDR<16:31>, TDR<32:47>, TDR<48:63>), with each test buffer 202 compressing the test result data signals and providing an appropriate signal level for respective output signal (PD<i>). In one embodiment, a test buffer 202 provides a logic high or logic low signal level depending upon whether all of the test result data signals received by the specific test buffer 202 are set at a logic high or logic low signal level, respectively. Consequently, each test buffer 202 provides a 16:1 compression by receiving sixteen test result data bit signals and providing one output (PD<i>) signal, but it should be understood that various other compression factors or even no compression may be implemented. For example, if no compression is required, then one test buffer 202 may be provided for each test result data (TDR<0:64>) signal or no test buffers 202 may be provided, with serial burst compression circuits 204 receiving the corresponding test data bit signals. Further description of an exemplary implementation for test buffer 202 is disclosed in U.S. patent application Ser. No. 09/666,208, entitled "CHIP TESTING WITHIN A MULTI-CHIP SEMICONDUCTOR PACKAGE," by Adrian E. Ong, filed Sep. 21, 2000, which is incorporated herein by reference in its entirety.

Figure 6A:
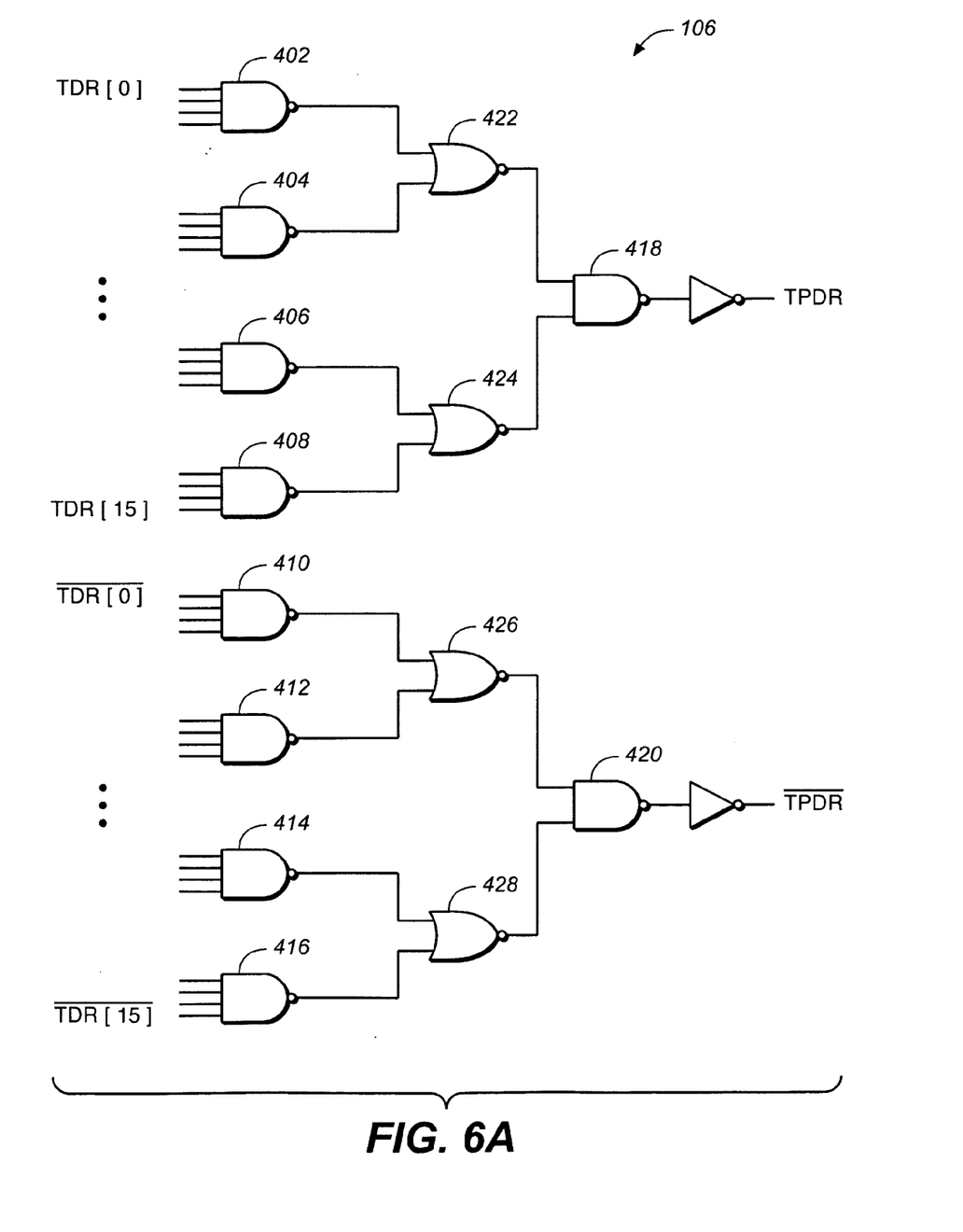
FIGS. 6A and 6B are schematic diagrams of an exemplary implementation for the external testing output circuit, in accordance with an embodiment of the present invention.
Figure 6B:
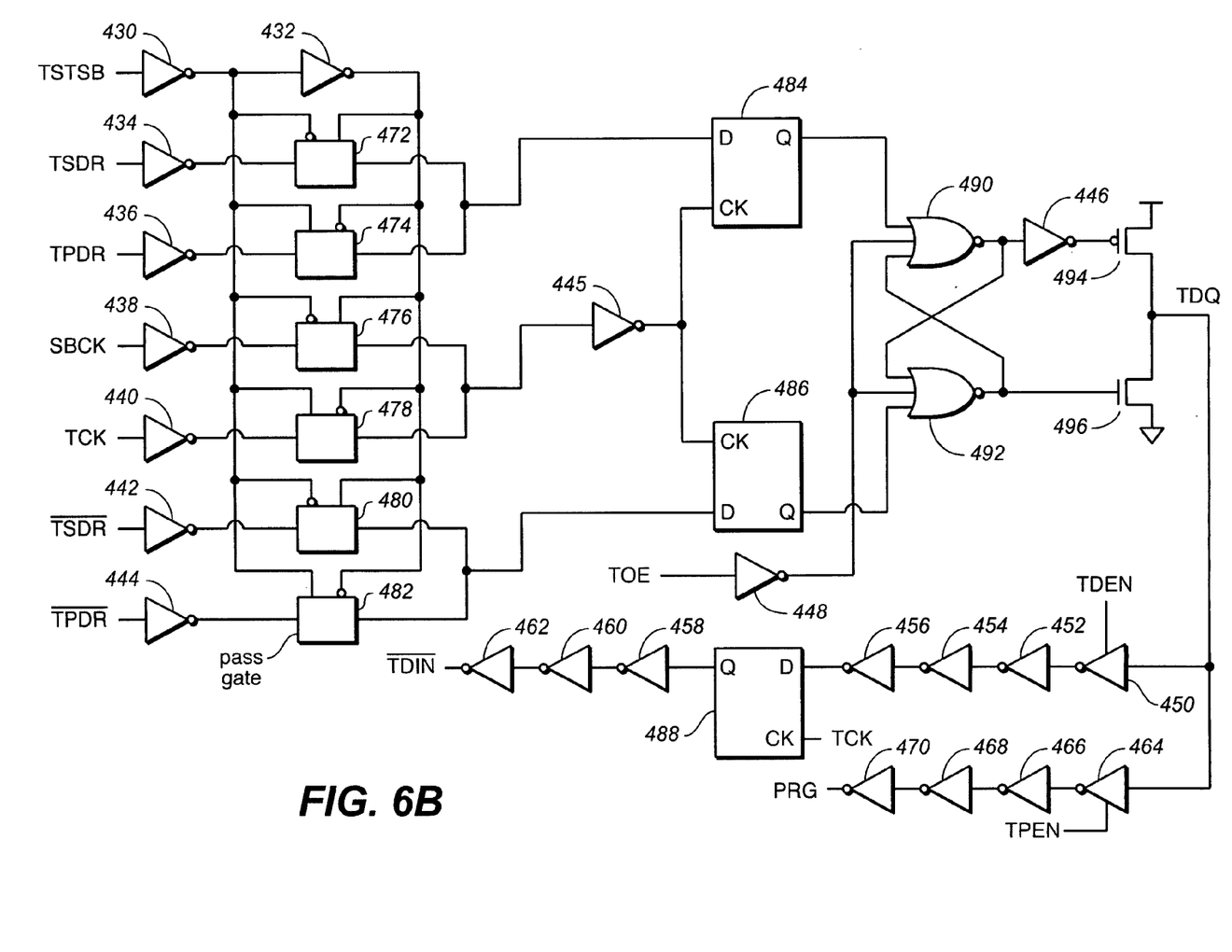

An exemplary implementation for external testing output circuit 106 is depicted in the schematic diagrams of FIGS. 6A and 6B. As depicted in FIG. 6A, in this implementation, external testing output circuit 106 comprises a plurality of NAND gates 402, 404, 406, 408, 410, 412, 414, 416, 418, 420, and a plurality of NOR gates 422, 424, 426, 428. As depicted in FIG. 6B, this implementation also includes a plurality of inverter gates 430, 432, 434, 436, 438, 440, 442, 444, 445, 446, 448, 450, 452, 454, 456, 458, 460, 462, 464, 466, 468, 470, a plurality of pass gates 472, 474, 476, 478, 480, 482, flip-flops 484, 486, 488, NOR gates 490, 492, and transistors 494, 496. The operation of this implementation for external testing output circuit 106 would be understood by one of ordinary skill.

NAND gates 402, 404, 406, 408, 410, 412, 414, 416, 418, 420, NOR gates 422, 424, 426, 428, inverter gates 430, 432, 434, 436, 438, 440, 442, 444, pass gates 472, 474, 476, 478, 480, 482, inverter gate 445, flip-flops 484, 486, NOR gates 490, 492, inverter gate 446, and transistors 494, 496 may be part of an output data path for the integrated circuit device 100, for example, for reading data from the device. A number of input terminals of this circuitry can be connected to the output terminals of one or more capture circuits 108, such as the exemplary implementation shown in FIG. 3, for receiving test result data signals (e.g., TDR<0:15> and the inverse (e.g., $\overline{\text{TDR<0:15>}}$). This circuitry may also receive a number of other signals including test serial burst (TSTCB) signal, test serial data result (TSDR) signal (and its inverse), test parallel data result (TPDR) signal (and its inverse), serial burst clock (SBCK) signal, and test clock (TCK) signal. Test serial data result (TSDR) signal relates to a configuration for outputting test result data in serial fashion. Test parallel data result (TPDR) signal relates to a configuration for outputting test result data in parallel.

Inverter gates 450, 452, 454, 456, 458, 460, 462, 464, 466, 468, 470, and flip-flop 488 can be part of an input data path for the integrated circuit device 100, for example, for writing data from the device. This circuitry can be connected to terminals of one or more capture circuits 108, such as the exemplary implementation shown in FIG. 3. As depicted, the circuitry receives a test data enable (TDEN) signal, a test program enable (TPEN) signal, and test clock (TCK) signal. The circuitry outputs a test data input ($\overline{\text{TDIN}}$), which may be input into capture circuits 108.

Figure 5:
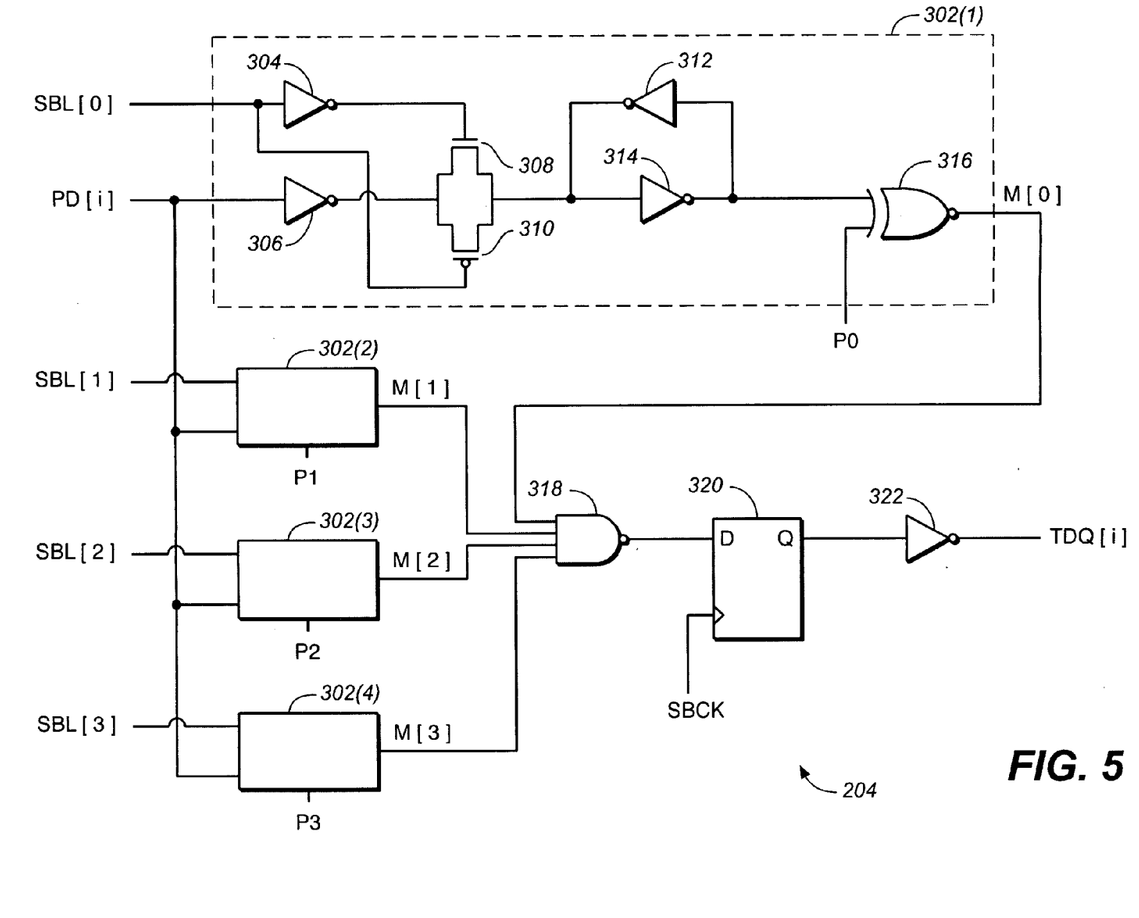
FIG. 5 is a schematic diagram in partial block form of an exemplary implementation for a serial burst compression circuit, in accordance with an embodiment of the present invention.

FIG. 5 is a schematic diagram in partial block form of an exemplary implementation for a serial burst compression circuit 204, in accordance with an embodiment of the present invention. As shown, in this implementation, serial burst compression circuit 204 includes a number of delay circuits 302, a NAND gate 318, a flip-flop 320, and an inverter gate 322.

Figure 7:
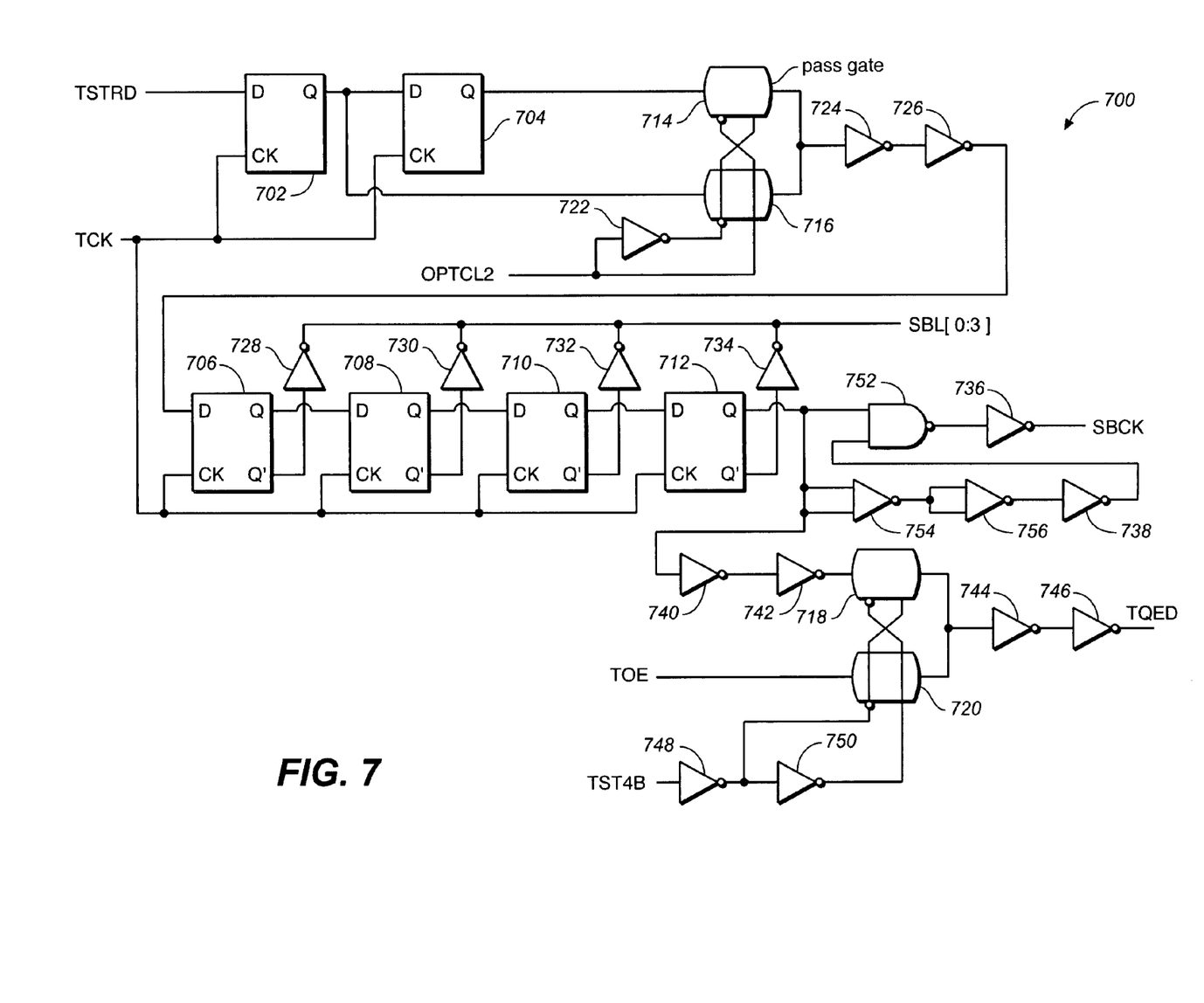
FIG. 7 is a schematic block diagram of a circuit for generating a serial burst clock signal and a plurality of serial burst latch signals, in accordance with an embodiment of the present invention.

Delay circuits 302 each receive an output signal PD<i> along with respective serial burst latch (SBL<0:3> signals; also referred to herein as simply L0, L1, L2, and L3) and respective expected test data (P<0:3>) signals, and provide respective match signals (M<0>, M<1>, M<2>, and M<3>). Latch (SBL<0:3>) signals may, have the same frequency, but different phases, as described with reference to FIG. 10. For example, serial burst latch (SBL<0:3>) signals may be generated from individual counters or a two-bit counter that counts up to four. An exemplary circuit for generating the serial burst latch (SBL <0:3>) signals and serial burst clock (SBCK) signal is depicted in FIG. 7.

NAND gate 318 receives the match (M<0:3>) signals and provides its output to the data (D) terminal of flip-flop 320. Flip-flop 320 also receives the serial burst clock (SBCK) signal and provides from the Q terminal of flip-flop 320 an output signal that is inverted by an inverter gate 322 to provide a delayed test output data (TDQ<i>) signal.

As shown, in one embodiment for delay circuit 302, output (PD<0>) signal is received by an inverter gate 306. Serial burst latch (SBL<0>) signal is received by an inverter gate 304 and at the gate terminal of a p-type transistor 310. The output of inverter gate 304 is received at the gate terminal of an n-type transistor 308. P-type transistor 310 and n-type transistor 308 form a pass gate. When serial burst latch (SBL<0>) signal transitions to a logic low signal level, the pass gate permits the output signal from inverter gate 306 to pass through to a latch formed by an inverter gate 314 and an inverter gate 312. An exclusive-NOR gate 316 receives the output signal from the latch (formed by inverter gates 314 and 316) along with expected test data (P<0>) signal and provides match (M<0>) signal.

Expected test data (P<0>) signal, along with expected test data signals (P<1>, P<2>, and P<3>), provide or carry the expected test data signal values to respective delay circuits 302. If an expected test data signal value (PD<0>, PD<1>, PD<2>, and PD<3>) matches the respective captured test data signal value (P<0>, P<1>, P<2>, and P<3>), a respective exclusive-NOR gate 316 will provide a logic high signal level for respective match signal (M<0>, M<1>, M<2>, and M<3>) to NAND gate 318. A logic high signal level for each of match (M<0:3>) signals indicates that the captured test data is correct and the integrated circuit device 100 under test is operating properly. In this case, NAND gate 318 outputs a logic low signal level, which causes exemplary test output data (TDQ<0>) signal to be a logic high signal level. Consequently, the data written to the integrated circuit device under test must be selected appropriately and known in order for expected test data (P<0:3>) signals to provide the expected test data signal values for comparison.

This exemplary circuit implementation for serial burst compression circuit 204 introduces a desired delay to the test result data captured as described herein. As an example, a delay of four cycles of the normal operational clock CLK signal can be introduced in this implementation due to the propagation of the captured test data through a number of logic gates and its latching within delay circuits 302. This permits the serial burst clock (SBCK) signal to operate at one-fourth the clock rate of CLK signal (which is internal to the integrated circuit device). A greater or lesser delay may be introduced by varying the number of delay circuits 302 in the implementation for serial burst compression circuit 204. The number of delay circuits 302 within serial burst compression circuit 204 is inversely proportional to the clock rate of the serial burst clock (SBCK) signal. Specifically, the clock rate of the serial burst clock (SBCK) signal equals the clock rate of the clock (CLK) signal divided by the number of delay circuits 302. Thus, if more delay circuits 302 are provided, the clock rate of the serial burst clock (SBCK) signal will be slower and vice versa. For example, for the four delay circuits 302 shown in FIG. 5, the clock rate of the serial burst clock (SBCK) signal is one-fourth of the clock rate of the clock (CLK) signal. If five delay circuits 302 are provided, the clock rate of the serial burst clock (SBCK) signal would be one-fifth of the clock rate of the clock (CLK) signal.

FIG. 7 is a schematic block diagram for a circuit 700 for generating a serial burst clock (SBCK) signal and a plurality of serial burst latch (SBL<0:3>) signals, in accordance with an embodiment of the present invention. Serial burst clock (SBCK) signal and serial burst latch (SBL<0:3>) signals are derived from a test clock (TCK) signal. The serial burst latch (SBL<0:3>) signals may have approximately the same frequency, but different phases.

As depicted, this circuit 700 includes a plurality of flip-flops 702, 704, 706, 708, 710, 712, a plurality of pass gates 714, 716, 718, 720, a plurality of inverter gates 722, 724, 726, 728, 730, 732, 734, 736, 738, 740, 742, 744, 746, 748, 750, a NAND gate 752, and two-input inverter gates 754, 756. The operation of this circuit 700 would be understood by one of ordinary skill.

Figure 8:
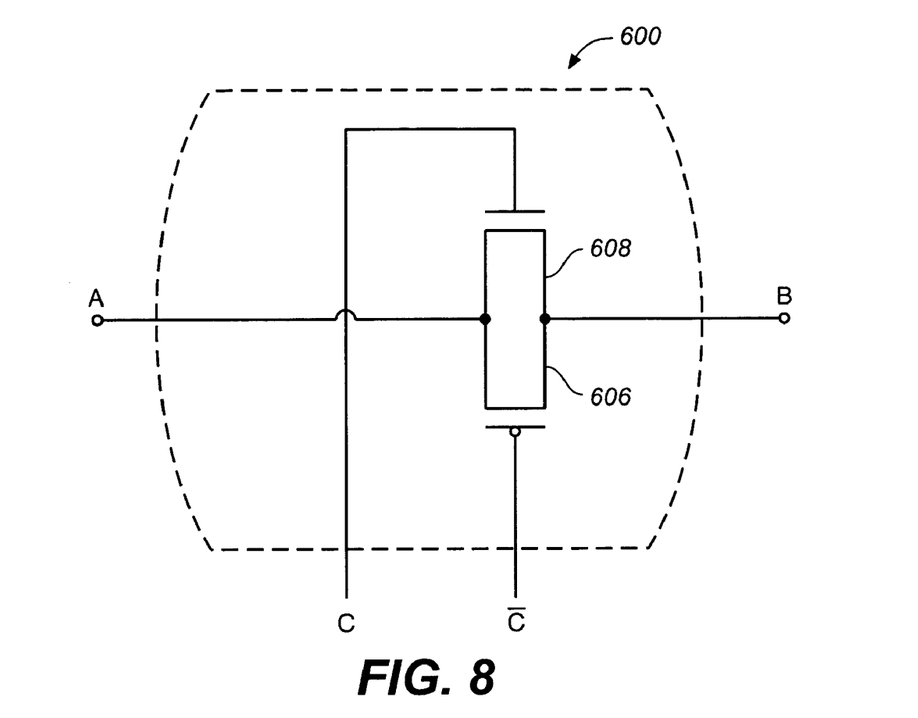
FIG. 8 is a schematic diagram for an implementation of a pass gate.

FIG. 8 illustrates an exemplary implementation for a pass gate 600 which is shown in FIGS. 6B and 7. As shown, pass gate 600 comprises a P-type transistor 606 and an N-type transistor 608 with their sources and drains coupled together. An enable signal C is applied to the gate of transistor 606, and the inverse of the enable signal C is applied to the gate of transistor 608. An input terminal of pass gate 600 receives a signal A, and a signal B appears at an output terminal for pass gate 600. In operation, when the value of the enable C is low (and, consequently, the value of the inverse of the enable signal is high), the value of the input signal A is passed through pass gate 600 as the value of signal B.

Figure 9:
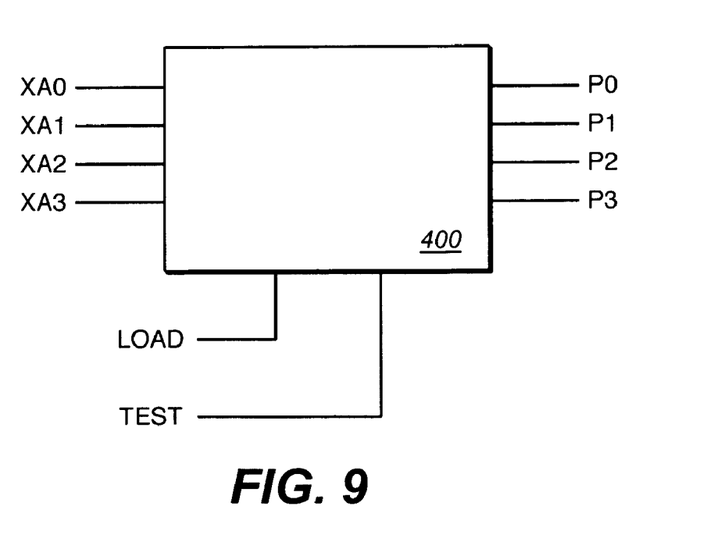
FIG. 9 is a block diagram for a pattern generator, in accordance with an embodiment of the present invention.

FIG. 9 is a block diagram for a pattern generator 400, in accordance with an embodiment of the present invention. Pattern generator 400 provides expected test data (P<0:3>) signals when loaded with the appropriate test data pattern, which is provided through a load (LOAD) signal. When pattern generator 400 receives the test enable (TEST) signal and is addressed via address signals (XA<0>, XA<1>, XA<2>, and XA<3>), pattern generator 400 provides the proper test data signals through expected test data (P<0:3>) signals to match those of output (PD<0:3>) signals described in reference to FIG. 4. Thus, for this example, if the integrated circuit under test is operating properly, test output data (TDQ<0:3>) signals will be set to logic high signal levels, indicating proper chip operation.

Figure 10:
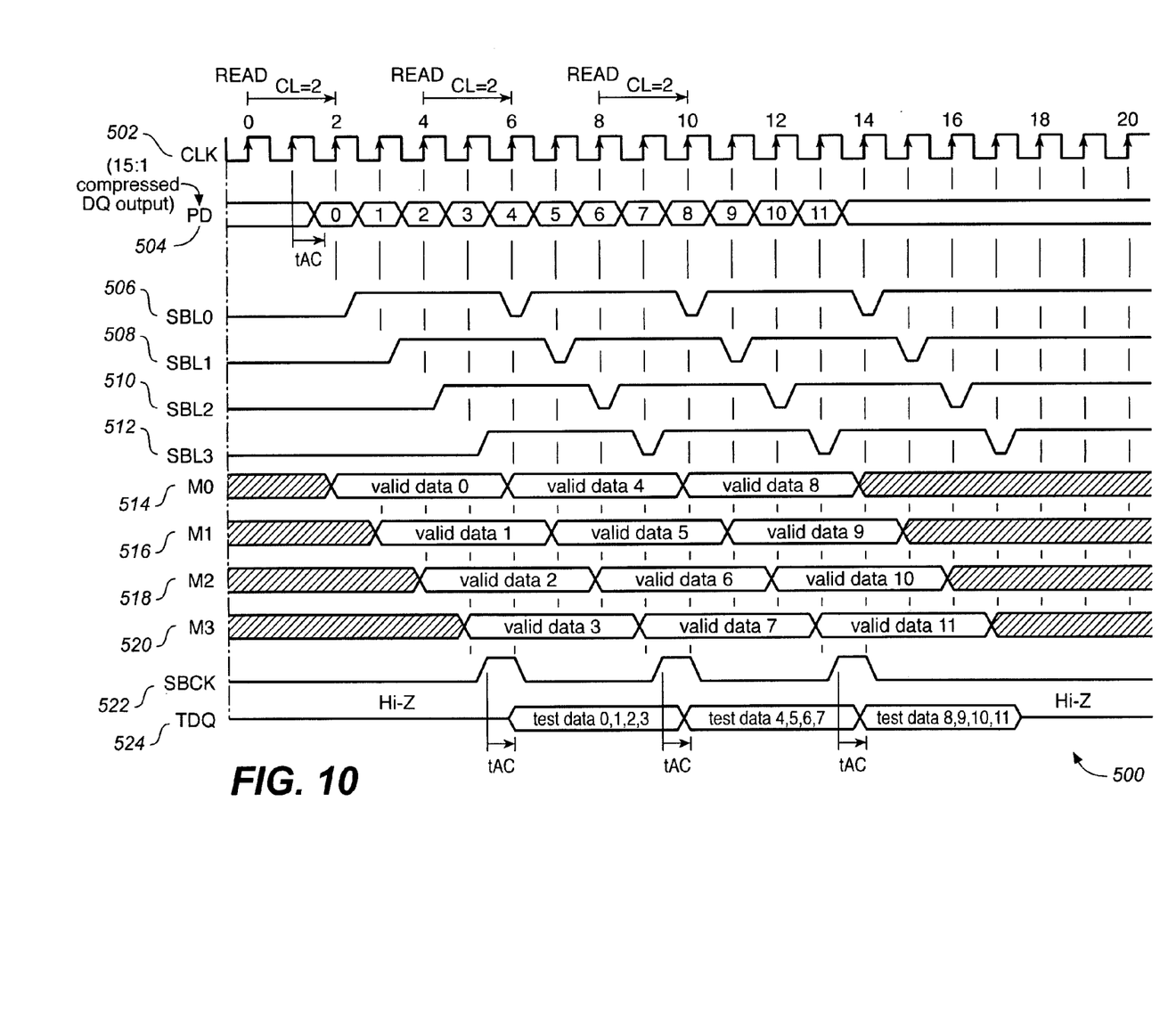
FIG. 10 is a timing diagram illustrating exemplary timing for signals, in accordance with an embodiment of the present invention.

FIG. 10 is a timing diagram 500 illustrating exemplary timing for signals, in accordance with an embodiment of the present invention. Timing diagram 500 includes a number of exemplary waveforms for corresponding signals related to integrated circuit device testing as described above in reference to FIGS. 1 through 4. These waveforms include waveform 502 for clock (CLK) signal, waveform 504 for output (PD) signals, waveforms 506 through 512 for respective latch (SBL<0:3>) signals, waveforms 514 through 520 for respective match (M<0:3>) signals, waveform 522 for social burst click (SBCK) signal, and waveform 524 for test output data (TDQ) signals.

CLK signal waveform 502 is shown at a high-frequency clock speed for the given data rate, while SBCK signal waveform 522 is shown at a slower clock speed (i.e., one-fourth of the high-frequency clock speed). Output signal PD waveform 504 represents the test data bit signals compressed at a ratio of 16:1, with the compressed data being clocked at the high data rate. Latch signal SBL<0:3> waveforms 506 through 512 transition to a logic high level in a sequential fashion to latch and extend the compressed test data. This results in output signal M<0:3> waveforms 514 through 520 transitioning in a sequential fashion, as described above, and extended out for a longer test data cycle. SBCK signal waveform 522 clocks out output signal TDQ waveform 524 at the reduced clock rate to the test equipment.

As an example, the operation of external testing output circuit 106 shown in FIG. 4 with respect to timing diagram 500 will be described briefly for several clock cycles of output signal PD waveform 504. At cycle 0 of output signal PD waveform 504 corresponding to the second clock cycle of CLK signal waveform 502, test buffers 202 receive respective test data (TDR<0:63>) signals and the test enable (TEST) signal (set true for this example) and, in response, provide respective output (PD<0:3>) signals. Serial burst compression circuits 204 receive respective output (PD<0:3>) signals, which are latched in response to latch signal SBL<0> waveform 506 and compared to respective expected test data (P<0>) signal. A match signal M<0> waveform 514 is generated respectively by each serial burst compression circuit 204 based on the comparison.

At cycle 1 of output signal PD waveform 504 corresponding to the third clock cycle of CLK signal waveform 502, test buffers 202 receive the next respective test data bit (TDR<0:63>) signals and the test enable (TEST) signal and, in response, provide respective output signals (PD<0:63>). Serial burst compression circuits 204 receive respective output (PD<0:63>) signals, which are latched in response to latch signal SBL<1> waveform 508 and compared to respective expected test data (P<1>) signal. A match signal M<1> waveform 516 is generated respectively by each serial burst compression circuit 204 based on the comparison.

This operation continues in a similar fashion for cycles 2 and 3 of output signal PD waveform 504 corresponding respectively to the fourth and fifth clock cycles of CLK signal waveform 502. In response to SBCK signal waveform 522, serial burst compression circuits 204 provide respective output signal TD waveforms 524 that provide the result of the integrated circuit device testing for this portion of testing. These steps may then be repeated starting with cycle 4 of output signal PD waveform 504 corresponding to the sixth clock cycle of CLK signal waveform 502 as illustrated in FIG. 5.

As described herein, the present invention provides improved systems and methods for testing high-frequency integrated circuit devices. In accordance with some embodiments of the present invention, circuitry is provided (either within the chip under test and/or on a separate chip) to latch and extend each cycle of test data for multiple cycles (e.g., N) of the internal clock for the chip or device under test. A testing machine operating at a lower-frequency can then detect the data at a reduced frequency or data rate (e.g., 1/N) while the integrated circuit device under test is operating at its own higher-frequency data rate. The data can be latched and extended to be valid for numerous cycles (e.g., N cycles).

Because the test data is latched and extended, the time for testing will increase (e.g., increased by N times). To reduce or eliminate the increased test time, the integrated circuit device can be stimulated with various known test patterns to allow compression of the test data. For example, if an integrated circuit device is operating at 400 MHz and the test data is extended by 8 cycles and compressed (e.g., sequential compression to prevent an increase in the test time), the testing machine can detect the testing output data while operating at 50 MHz. Thus, during normal operation for the integrated circuit device, one bit of data is output every clock cycle, but during test mode operation, the first eight sequential bits (for example, when N equals eight) are stored and compared, with the result provided to the testing machine after the eighth cycle.

Embodiments described above illustrate but do not limit the invention. It should also be understood that numerous modifications and variations are possible in accordance with the principles of the present invention. For example, although an exemplary test circuit configuration arranged in a parallel fashion to output buffer 122 is illustrated, a test circuit 122 configuration arranged in a series fashion to output buffer could also be arranged in accordance with the principles of the present invention. Accordingly, the scope of the invention is defined only by the following claims.

What is claimed is:

1. An packaged integrated circuit system comprising:
  a first integrated circuit device to be tested, the first integrated circuit device contained in a package, the first integrated circuit device operable to output test data at a first clock rate internal to the first integrated circuit device; and
  a second integrated circuit device connected to and contained in the same package as the first integrated circuit device, the second integrated circuit device operable to receive the test data from the first integrated circuit device and to provide a result in response to the test data at a second clock rate that is slower than the first clock rate.

2. The packaged integrated circuit system of claim 1 wherein at least one of the first integrated circuit device and the second integrated circuit device comprises a memory device, a logic device, a processor, or an application specific integrated circuit.

3. The packaged integrated circuit system of claim 1 wherein each of the first integrated circuit device and the second integrated circuit device comprises a monolithic die.

4. The packaged integrated circuit system of claim 1 wherein the first integrated circuit device comprises a data buffer coupled to at least one external connector of the packaged integrated circuit system, the data buffer operable to provide a data signal on the at least one external connector.

5. The packaged integrated circuit system of claim 4 wherein the first integrated circuit device comprises a test buffer coupled to the data buffer and operable to receive the data signal and provide a testing output signal conveying the test data.

6. The packaged integrated circuit system of claim 5 wherein the first integrated circuit device comprises a delay circuit coupled to the test buffer and adapted to receive the testing output signal at the first clock rate internal to the first integrated circuit device, wherein the delay circuit compares the test data in the testing output signal to expected test data values and provides a result to at least one of the external connectors at the second clock rate.

7. The packaged integrated circuit system of claim 6 wherein the delay circuit receives latch signals to latch the testing output signal received from the test buffer.

8. The packaged integrated circuit system of claim 5 wherein the testing output signal from the test buffer represents the data signal in a compressed form.

9. The packaged integrated circuit system of claim 5 wherein the test buffer is coupled to the data buffer through a logic gate, the logic gate providing the data signal to the test buffer upon receipt of a test signal.

10. The packaged integrated circuit system of claim 1 wherein at least one of the first integrated circuit device and the second integrated circuit device comprises a random access memory (RAM), a static RAM, a dynamic RAM, a non-volatile RAM, a read only memory (ROM), a programmable ROM, an erasable programmable ROM, an electrically erasable programmable ROM, or a flash memory.

11. A method of testing a integrated circuit device comprising:
  generating test data at a first clock rate internal to the first integrated circuit device;
  comparing the generated test data to expected test data values;
  providing an output signal to external integrated circuit test equipment at a second clock rate that is slower than the first clock rate, the output signal indicating a result of the comparison.

12. The method of claim 11 comprising staggering the comparison of the test data to the expected test data values.

13. The method of claim 11 comprising compressing the generated test data.

14. The method of claim 11 comprising providing a pattern generator that provides the expected test data values to the integrated circuit device.

15. The method of claim 11 wherein the integrated circuit device comprises a random access memory (RAM), a static RAM, a dynamic RAM, a non-volatile RAM, a read only memory (ROM), a programmable ROM, an erasable programmable ROM, an electrically erasable programmable ROM, or a flash memory.

16. The method of claim 11 wherein the integrated circuit device comprises a memory device, a logic device, a processor, or an application specific integrated circuit.

17. An integrated circuit device comprising:
a data buffer operable to be connected to at least one of a plurality of external connectors for an integrated circuit package, the data buffer operable to provide a data signal on the at least one of the plurality of external connectors;
a test buffer coupled to the data buffer and operable to receive the data signal and provide a testing output signal; and
a delay circuit coupled to the test buffer and operable to receive the testing output signal at a first clock rate internal to the integrated circuit device, to compare test data in the testing output signal to expected test data values, and to provides a result to the at least one of the plurality of external connectors at a second clock rate that is slower than the first clock rate.

18. The integrated circuit device of claim 17 wherein the testing output signal from the test buffer represents the data signal in a compressed form.

19. The integrated circuit device of claim 17 wherein the delay circuit receives latch signals to latch the testing output signal received from the test buffer.

20. The integrated circuit device of claim 17 wherein the integrated circuit device comprises a random access memory (RAM), a static RAM, a dynamic RAM, a non-volatile RAM, a read only memory (ROM), a programmable ROM, an erasable programmable ROM, an electrically erasable programmable ROM, or a flash memory.

21. The integrated circuit device of claim 17 wherein the integrated circuit device comprises a memory device, a logic device, a processor, or an application specific integrated circuit.

22. The integrated circuit device of claim 17 wherein the test buffer is coupled to the data buffer through a logic gate, the logic gate providing the data signal to the test buffer upon receipt of a test signal.

* * * * *